United States Patent [19]
Chen et al.

[11] Patent Number: 5,877,947
[45] Date of Patent: Mar. 2, 1999

[54] SNUBBER CIRCUIT FOR A RECTIFIER AND METHOD OF OPERATION THEREOF

[75] Inventors: Qing Chen; Victor Ke-Ji Lee, both of Plano, Tex.

[73] Assignee: Lucent Technologies Inc., Murray Hill, N.J.

[21] Appl. No.: 903,407

[22] Filed: Jul. 30, 1997

[51] Int. Cl.$^6$ .......................... H02H 7/125; H02H 7/122; H02M 7/5387
[52] U.S. Cl. .............................. 363/53; 363/56; 363/124; 363/131; 363/132
[58] Field of Search ............................... 363/53, 56, 123, 363/125, 131, 132

[56] References Cited

U.S. PATENT DOCUMENTS

| | | | |
|---|---|---|---|
| 4,977,493 | 12/1990 | Smith | 363/126 |
| 5,130,917 | 7/1992 | Shekhawat | 363/56 |
| 5,258,902 | 11/1993 | Lindbery et al. | 363/56 |
| 5,351,179 | 9/1994 | Tsai et al. | 363/53 |
| 5,471,376 | 11/1995 | Tsai et al. | 363/20 |
| 5,642,273 | 6/1997 | Lai et al. | 363/56 |
| 5,684,688 | 11/1997 | Rouaud et al. | 363/132 |
| 5,731,966 | 3/1998 | Liu | 363/53 |

OTHER PUBLICATIONS

"Design Considerations for High–Power Full–Bridge Zero–Voltage–Switched PWM Converter" by J.A. Sabate, V. Vlatkovic, R.B. Ridley, F.C. Lee, and B.H. Cho; IEEE Applied Power Electronics Conf. 1990; pp. 275–284.

"Optimization and Design Issues of Low Output Voltage, Off–Line, Zero–Voltage–Switched PWM Converters" by Q. Chen, A. Lotfi, F.C. Lee; Proc. IEEE Applied Power Electronics Conf. Mar. 1992, pp. 449–455.

"A 1kW, 500 kHz Front–End Converter for a Distributed Power Supply System" by L.H. Mweene, C.A. Wright and M.F. Schlecht; Proc. IEEE Applied Power Electronics Conf., Mar. 1989; pp. 423–432.

"A Novel Soft–Switching Full–Bridge DC/DC Converter: Analysis, Design Considerations and Experimental Results at 1.5kW, 100kHz" by R. Redl, N.O. Sokal and L. Balogh; IEEE Power Electronics Specialists Conf. Rec., 1990. pp. 162–172.

"An Improved Zero–Voltage–Switched PWM Converter Using a Saturable Inductor" by G. Hua, F.C. Lee and M.M. Jovanovic; IEEE Power Electronics Specialists Conf. Rec., 1991; pp. 189–194.

"Switched Snubber for High Frequency Switching" by K. Harada and H. Sakamoto; IEEE Power Electronics Specialists Conf. Rec., 1990, pp. 181–188.

"High–Voltage, High Power, ZVS, Full–Bridge PWM Converter Employing an Active Snubber" by V. Vlatkovic, J.A. Sabate, R.B. Ridley and F.C. Lee; Proc. IEEE Applied Power Electronics Conf., Mar. 1991, pp. 158–163.

*Primary Examiner*—Peter S. Wong
*Assistant Examiner*—Rajnikant B. Patel

[57] ABSTRACT

For use in a power converter having a rectifier coupled to an output thereof, a snubber circuit including an energy storage device coupled to the rectifier that moderates a voltage across the rectifier and a method of moderating the voltage. In one embodiment, the snubber circuit includes: (1) a first switch that regulates a voltage across the energy storage device, (2) an inductor, coupled to the first switch, that provides a discharge path for energy stored in the energy storage device when the first switch is conducting and (3) a second switch that recovers energy stored in the inductor to the output when the first switch is not conducting. The snubber circuit thereby reduces voltage stress across the rectifier during a current limit mode of operation.

20 Claims, 5 Drawing Sheets

Vca (DURING CURRENT LIMIT OPERATION)

Vca (DURING NORMAL OPERATION)

SNUBBER CIRCUIT FOR A RECTIFIER AND METHOD OF OPERATION THEREOF

TECHNICAL FIELD OF THE INVENTION

The present invention is directed, in general, to power supplies and, more specifically, to a snubber circuit for a rectifier and a method of operation thereof.

BACKGROUND OF THE INVENTION

A power converter is a power processing circuit that converts an input voltage or current source waveform into a specified output voltage or current waveform. A full-bridge phase-shift pulse-width-modulated power converter (hereinafter referred to as a FPP converter) is a frequently employed switched-mode power converter that converts a direct current (DC) input waveform to a specified DC output waveform. The FPP converter generally includes switching circuitry coupled to an input source of electrical power. The switching circuitry includes two pairs of alternately conducting active switches. A primary winding of a transformer is coupled to the switching circuitry and a secondary winding of the transformer is coupled to a rectifier circuit (e.g., rectifying diodes). The rectifier circuit is coupled through an output filter to a load.

While the FPP converter employs the leakage inductance of the transformer to achieve zero-voltage switching (ZVS) across the active switches, other sources of inefficiencies exist in the FPP converter. More specifically, a parasitic capacitance in the form of the winding capacitance in the transformer and junction capacitance of the rectifying diodes resonate with the leakage inductance thereby inducing transients (e.g., ringing and voltage spikes) in the secondary side of the FPP converter. The transients are intensified in higher power and current applications. The transients are especially harmful to the rectifier circuit and noticeably affect the overall efficiency of the FPP converter.

There have been attempts in the past to minimize the effects of transients in power converters and the resulting stress on rectifier circuits. For instance, a primary clamping circuit that includes a pair of clamping diodes and an auxiliary inductor on the primary side of the transformer is disclosed in A Novel Soft-Switching Full-Bridge DC/DC Converter: analysis, design considerations and experimental results at 1.5 kW, 100 kHz, by R. Redl, N. O. Sokai and L. Balogh, IEEE Power Electronics Specialists Conf. Rec., p. 162–172 (1990) which is herein incorporated by reference. In general, the leakage inductance of the transformer is minimized and, with the assistance of the auxiliary inductor, ZVS is achieved across the switching circuitry. The voltage across the primary winding of the transformer is clamped by the clamping diodes at the line voltage of the power converter or the ground. As a result, the resonance between the auxiliary inductor and the parasitic capacitance in the windings of the transformer does not induce excessive voltage stress across the rectifier circuit. While in theory the reduction in voltage stress appears viable, the primary clamping circuit does not actually minimize the transients across the rectifier circuit. While the voltage across the primary winding is clamped at or near the input voltage, the voltage in the secondary side of the power converter still rings due to the resonance between the leakage inductance and parasitic capacitance of the transformer and the junction capacitances of the diodes. Therefore, the primary clamping circuit is ineffective in reducing the voltage stress across the rectifier circuit, especially in higher power applications.

A resistor-capacitor-diode (RCD) snubber circuit is disclosed in A 1 kW, 500 kHz Front-End Converter for a Distributed Power Supply System, by L. H. Mweene, C. A. Wright and M. F. Schlecht, Proc. IEEE Applied Power Electronics Conf., p. 423–432 (1989) which is herein incorporated by reference. A RCD snubber circuit is coupled to the rectifier circuit in the secondary side of the transformer. As opposed to disposing the energy diverted from the rectifier circuit within the power converter itself, the RCD snubber circuit attempts to divert the energy to the output of the power converter. While the RCD snubber circuit is a relatively simple design, the circuit suffers from substantial power dissipation across the resistor that substantially affects the overall efficiency of the power converter. As the current through the power converter increases, the losses escalate thereby limiting the RCD snubber to low power applications.

Another component readily employed to reduce the voltage stress on a rectifier circuit is a saturable reactor. A saturable reactor circuit is disclosed in An Improved Zero-Voltage-Switched Pulse-Width-Modulated Converter Using a Saturable Inductor, by G. Hua, F. C. Lee and M. M. Jovanovic, IEEE Power Electronics Specialists Conf. Rec., p. 189–194 (1991) which is herein incorporated by reference. Conventionally, a saturable reactor is series-coupled to each rectifying diode of the rectifier circuit. While the saturable reactor does a relatively good job of limiting the voltage stress across the rectifier circuit, the saturable reactors exhibit losses that result in a relatively high temperature rise across the core and windings thereof. The temperature rise can be alleviated by employing several saturable reactors in parallel, but at the cost of valuable space on the printed circuit board and a prohibitively expensive saturable reactor circuit. As previously mentioned, the aforementioned circuits and other prior art circuits have inadequately dealt with the transients that adversely effect the rectifier circuit in power converters.

Accordingly, what is needed in the art is a snubber circuit for a rectifier circuit that minimizes the voltage stress thereacross to reduce the power losses associated with the rectifier circuit and oscillations in both voltage and current therefrom and is suitable for a vast range of power applications including higher power applications.

SUMMARY OF THE INVENTION

To address the above-discussed deficiencies of the prior art, the present invention provides, for use in a power converter having a rectifier coupled to an output thereof, a snubber circuit including an energy storage device coupled to the rectifier that moderates a voltage across the rectifier and a method of moderating the voltage.

In one aspect of the present invention, the snubber circuit includes: (1) a first switch that regulates a voltage across the energy storage device, (2) an inductor, coupled to the first switch, that provides a discharge path for energy stored in the energy storage device when the first switch is conducting and (3) a second switch that recovers energy stored in the inductor to the output when the first switch is not conducting, the snubber circuit thereby reducing a voltage stress across the rectifier during a current limit mode of operation.

In an alternative, but related aspect of the present invention, the snubber circuit further includes: (1) an auxiliary switch that regulates a voltage across the energy storage device and (2) an output inductor, coupled to the auxiliary switch, that provides a discharge path for energy stored in the energy storage device when the auxiliary switch is conducting, the snubber circuit thereby reducing a voltage stress across the rectifier during a normal mode of operation.

The present invention, therefore, introduces a snubber circuit that reduces the voltage stress across the rectifier during the normal and current limit modes of operation. For reasons that will be more apparent, in the current limit mode of operation, the conduction period of the first switch decreases leading to an increase in the voltage across the energy storage device. The inductor and second switch are introduced to modulate the voltage across the energy storage device thereby reducing the voltage stress across the rectifier. As a result, lower voltage rated components may be employed thereby reducing the component costs and minimizing the losses associated with the rectifier.

The foregoing has outlined, rather broadly, features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
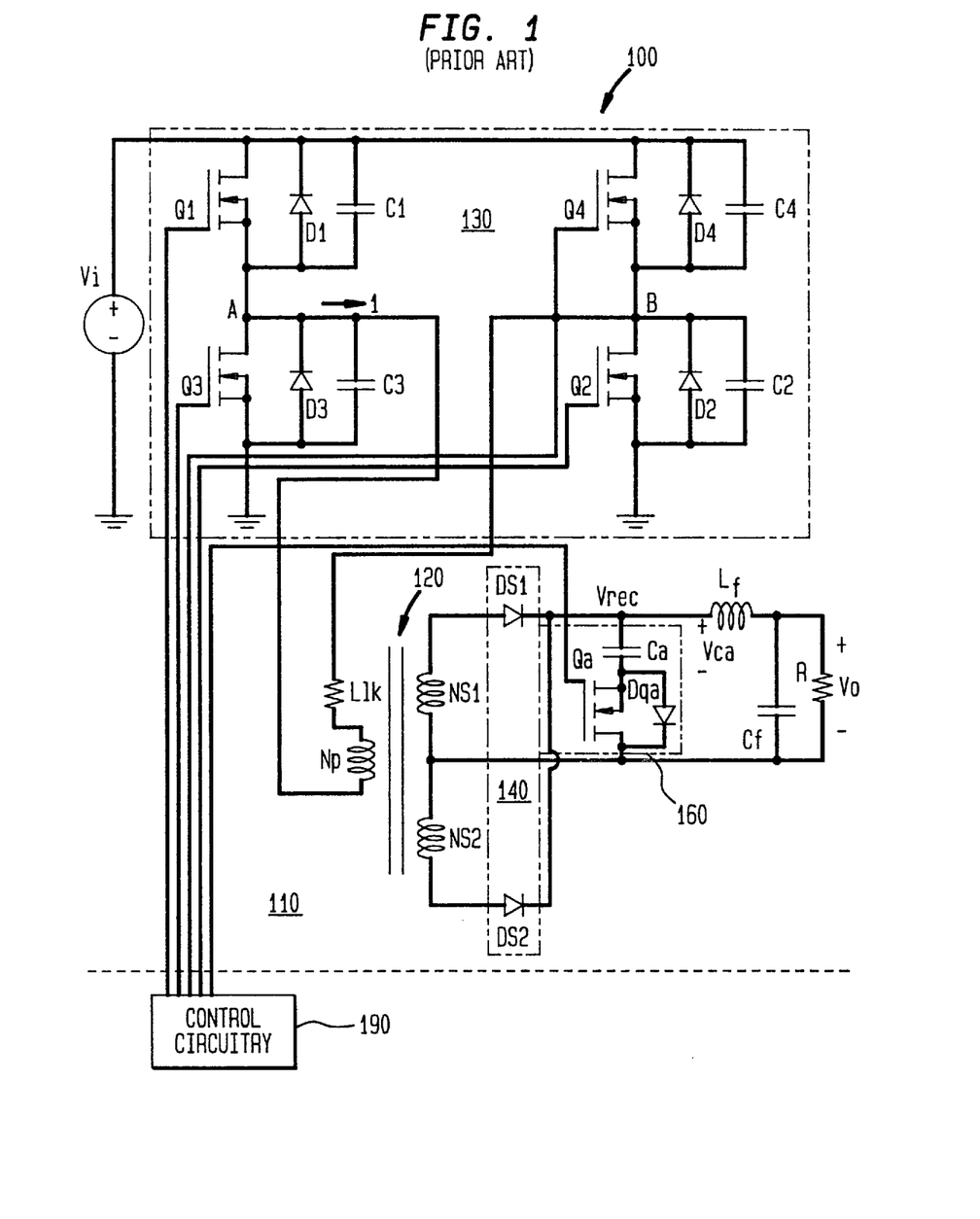
FIG. 1 illustrates a schematic diagram of a power converter employing a prior art snubber circuit.

Referring initially to FIG. 1, illustrated is a schematic diagram of a power converter 100 employing a prior art snubber circuit 160. The power converter 100 includes a power train 110 having an input coupled to an input source of electrical power with an input voltage Vi and a DC output coupled to an electrical load R. The power converter 100 further includes control circuitry 190 for applying control signals to the power train 110.

The power train 110 includes an isolation transformer 120 having a primary winding Np, two secondary windings Ns1, Ns2 and a leakage inductance Llk. Those skilled in the art should realize, however, that the leakage inductance Llk may be either the leakage inductance of the isolation transformer 120, an external inductor, or a combination thereof. The power train 110 further includes switching circuitry 130 coupling the input voltage Vi to the primary winding Np. The switching circuitry 130 consists of a first, second, third, and fourth switch Q1, Q2, Q3, Q4, having parasitic capacitances C1, C2, C3, C4 and body diodes D1, D2, D3, D4, respectively. The first, second, third, and fourth switches Q1, Q2, Q3, Q4, alternately conduct current, thereby providing AC power to the isolation transformer 120. The power train 110 further includes a rectifier 140, consisting of two rectifying diodes Ds1, Ds2, coupled to the secondary windings Ns1, Ns2. The power train 110 further includes an output inductor Lf and an output filter circuit (a capacitor Cf). The capacitor Cf couples the rectifier 140 to the electrical load R. The power train 110 still further includes a snubber circuit 160, consisting of an auxiliary switch Qa in series with a snubber capacitor Ca, coupled between the rectifier 140 and the inductor Lf.

Figure 2A:
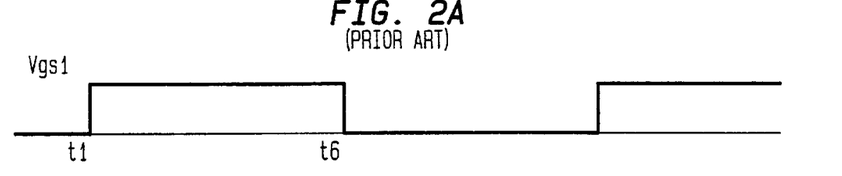
FIG. 2 illustrates voltage and current waveforms of selected operational characteristics of the power converter of FIG. 1 during a normal mode of operation.
Figure 2B:
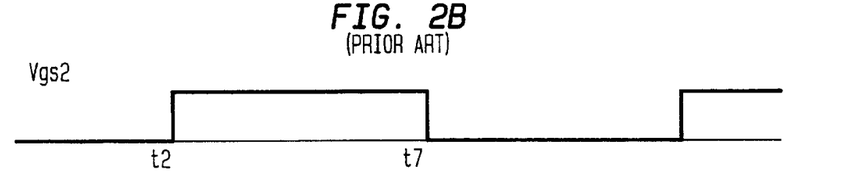
Figure 2C:
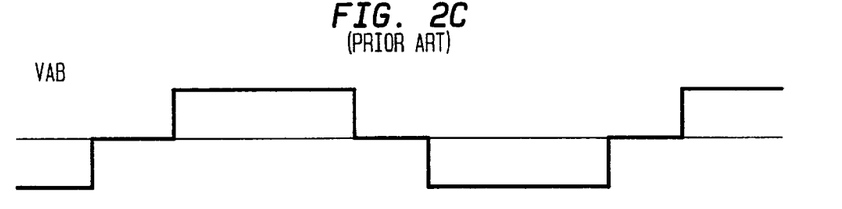
Figure 2D:
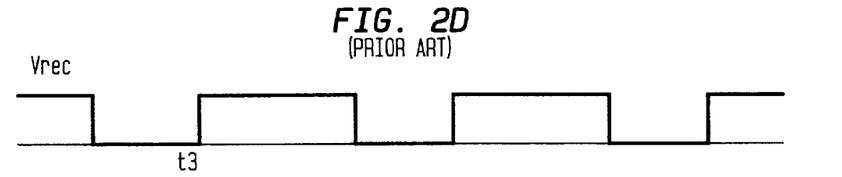
Figure 2E:
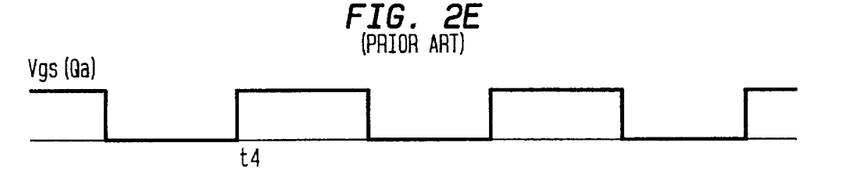
Figure 2F:
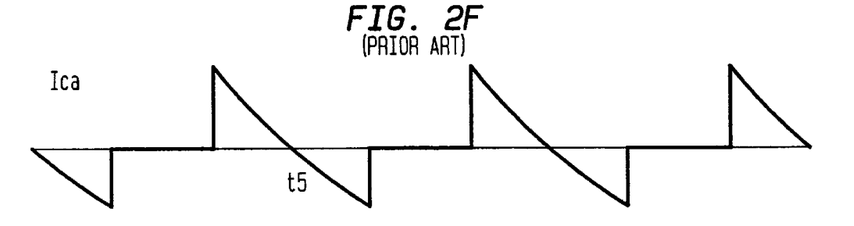
Figure 2G:
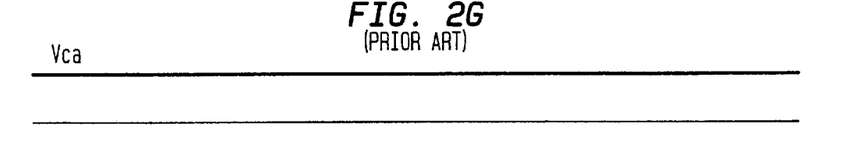

Turning now to FIGS. 2A through 2G, illustrated are voltage and current waveforms of selected operational characteristics of the power converter 100 of FIG. 1 during a normal mode of operation. In particular, FIG. 2A represents a first control voltage Vgs1 applied to the first switch Q1 by the control circuitry 190. FIG. 2B represents a second control voltage Vgs2 applied to the second switch Q2 by the control circuitry 190. FIG. 2C represents a primary voltage VAB across the primary winding Np of the isolation transformer 120. FIG. 2D represents a rectifier voltage vrec at an output of the rectifier 140. FIG. 2E represents an auxiliary control voltage Vgs(Qa) applied to the auxiliary switch Qa by the control circuitry 190. FIG. 2F represents a snubber capacitor current Ica through the snubber capacitor Ca. FIG. 2G represents a snubber capacitor voltage Vca across the snubber capacitor Ca.

With continuing reference to FIG. 1, the power converter 100 normally operates as follows. The first switch Q1 is turned on at a first time t1 (see FIG. 2A). At a second time t2, the second switch Q2 is turned on (see FIG. 2B). With both the first and second switches Q1, Q2 on, the input voltage Vi is impressed across the primary winding Np. The primary voltage VAB becomes equivalent to the input voltage Vi (see FIG. 2C). At a third time t3, the rectifier voltage Vrec goes high, and a body diode Dqa of the auxiliary switch Qa starts to conduct current, charging the snubber capacitor Ca (see FIGS. 2D and 2F). Shortly thereafter, the auxiliary switch Qa is turned on at a fourth time t4 (see FIG. 2E). The snubber capacitor current Ica decays, and, at a fifth time t5, reverses direction, flowing to the output through the auxiliary switch Qa and the filter inductor Lf (see FIG. 2F). At a sixth time t6, the first switch Q1 is turned off, thereby setting the primary voltage VAB to zero (see FIGS. 2A and 2C). The auxiliary switch Qa is turned off at substantially the same time (see FIG. 2E). The auxiliary switch Qa is timed to turn on after the input voltage Vi is applied across the primary winding Np and to turn off concurrently with the removal of the input voltage Vi. The snubber circuit 160 thus effectively maintains the snubber capacitor voltage Vca at a constant level, thereby reducing the voltage stress across the rectifying diodes Ds1, Ds2 (see FIG. 2G).

The power converter 100 provides constant power to the load R. The load R may, however, require a higher current than the power converter 100 can normally supply, forcing the power converter 100 into a heavy current mode of operation, also known as a current limit mode of operation. Once maximum power output is achieved, an increasing demand for current will necessarily result in a corresponding decrease in the output voltage Vo. The power converter 100 can continue to operate in this mode as long as the output voltage Vo is above a minimal lockout voltage. The reduction in the output voltage Vo is necessary such that the total power output of the power converter 100 does not exceed its power rating. Since the input voltage Vi is fixed, the control circuitry 190 must decrease the output voltage Vo by reducing a duty cycle of the switching circuitry 130.

Figure 3A:
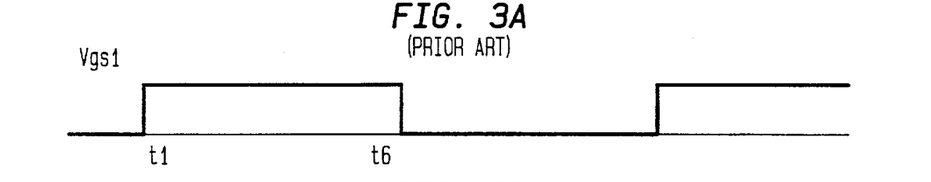
FIG. 3 illustrates voltage and current waveforms of selected operational characteristics of the power converter of FIG. 1 during a current limit mode of operation.
Figure 3B:
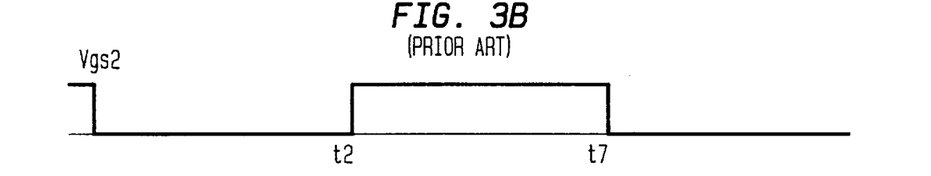
Figure 3C:
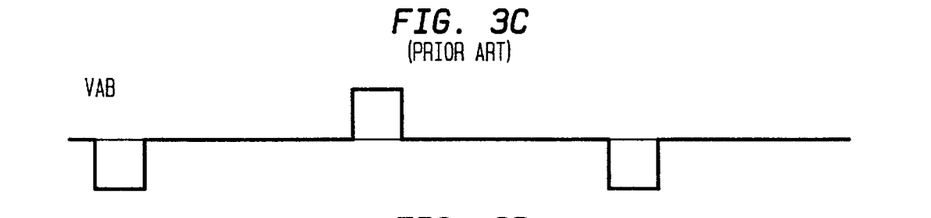
Figure 3D:
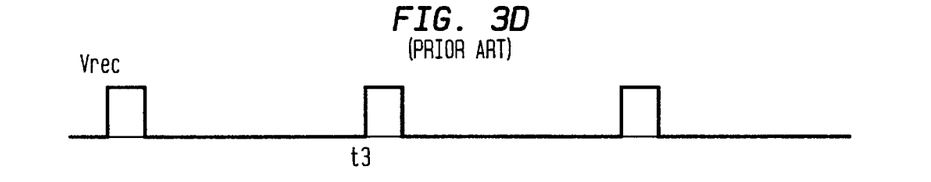
Figure 3E:
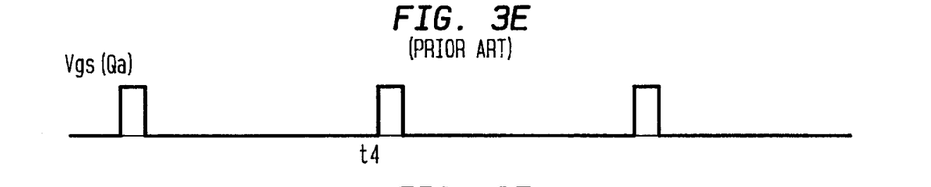
Figure 3F:
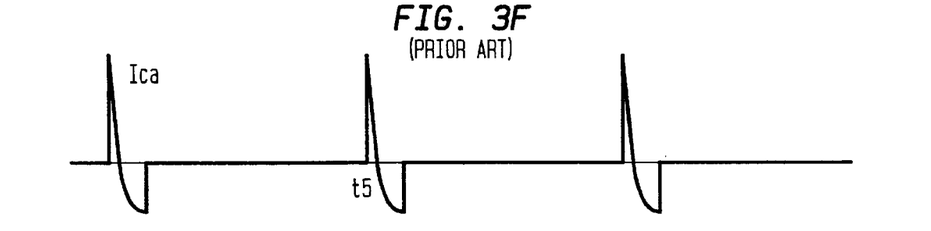
Figure 3G:
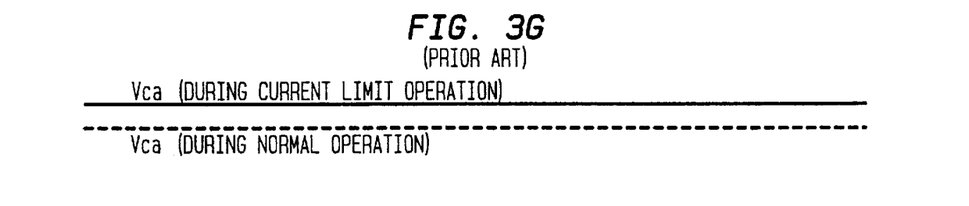

Turning now to FIGS. 3A through 3G, illustrated are voltage and current waveforms of selected operational characteristics of the power converter 100 of FIG. 1 during the current limit mode of operation. In particular, FIG. 3A represents the first control voltage Vgs1 applied to the first switch Q1 by the control circuitry 190. FIG. 3B represents the second control voltage Vgs2 applied to the second switch Q2 by the control circuitry 190. FIG. 3C represents the primary voltage VAB across the primary winding Np of the isolation transformer 120. FIG. 3D represents the rectifier voltage Vrec at the output of the rectifier 140. FIG. 3E represents the auxiliary control voltage Vgs(Qa) applied to the auxiliary switch Qa by the control circuitry 190. FIG. 3F represents the snubber capacitor current Ica through the snubber capacitor Ca. FIG. 3G represents the snubber capacitor voltage Vca across the snubber capacitor Ca.

With continuing reference to FIG. 1, the power converter 100 operates as follows in the current limit mode of operation. The control circuitry 190 decreases the duty cycle of the switching circuitry 130 by increasing a phase shift between the first and second control voltages Vgs1, Vgs2 (see FIGS. 3A and 3B). A phase shift between the third and fourth control voltages is likewise increased. The input voltage Vi is thus impressed across the primary winding Np for only a short time each cycle (see FIG. 3C). Accordingly, the snubber circuit 160 is on for only a short time (see FIG. 3E). The snubber capacitor Ca, however, must still be charged and discharged within the time the snubber circuit 160 is on (see FIG. 3F). The snubber capacitor Ca is charged by the high current, but has a much shorter discharge time as compared to the normal mode of operation. Without adequate discharge time, the snubber capacitor Ca retains its charge, building up voltage. The snubber capacitor voltage Vca thus becomes very high, increasing the voltage stress across the rectifying diodes Ds1 and Ds2.

Although the snubber circuit 160 is effective in reducing the voltage stress across the rectifying diodes Ds1, Ds2 during the normal mode of operation, it is unable to reduce the voltage stress in the current limit mode of operation due to the limited discharge time available.

Figure 4:
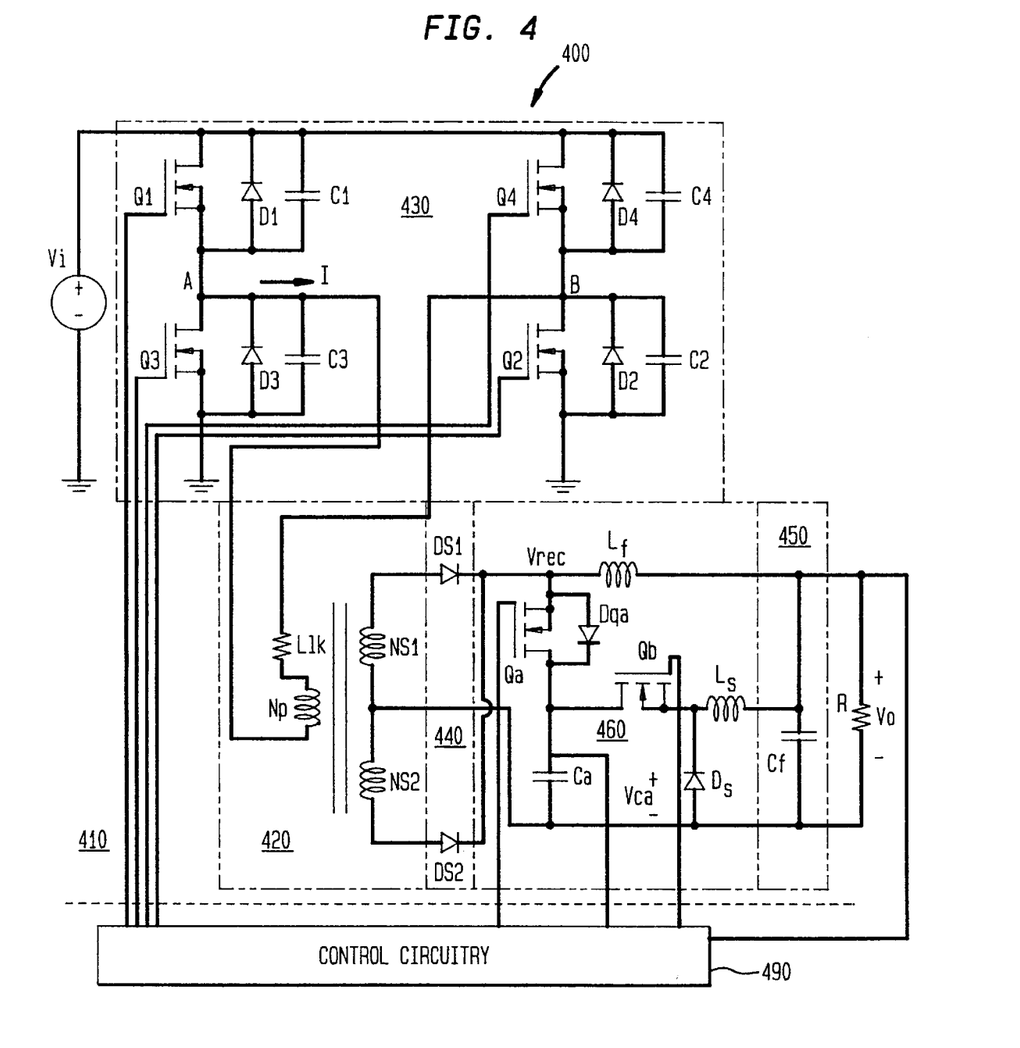
FIG. 4 illustrates a schematic diagram of a representative power converter employing an embodiment of a snubber circuit constructed according to the principles of the present invention.

Turning now to FIG. 4, illustrated is a schematic diagram of a representative power converter 400 employing an embodiment of a snubber circuit 460 constructed according to the principles of the present invention. The power converter 400 includes a power train 410, having an input and a DC output, and control circuitry 490 that senses a voltage of the DC output and applies control signals to the power train 410. The input of the power train 410 is coupled to an input source of electrical power with an input voltage Vi. The DC output is coupled to an electrical load R.

The power train 410 includes an isolation transformer 420 having a primary winding Np, two secondary windings Ns1, Ns2, and a leakage inductance Llk. Those skilled in the art should realize, however, that the leakage inductance Llk may be either the leakage inductance of the isolation transformer 420, an external inductor, or a combination thereof. The power train 410 further includes switching circuitry 430 coupling the input voltage Vi to the primary winding Np. The switching circuitry 430, in this embodiment of the present invention, consists of a first, second, third, and fourth switch Q1, Q2, Q3, Q4, having parasitic capacitances C1, C2, C3, C4 and body diodes D1, D2, D3, D4, respectively. The first, second, third, and fourth switches Q1, Q2, Q3, Q4, alternately conduct current, thereby providing AC power to the isolation transformer 420. The power train 410 further includes a rectifier 440 coupled to the secondary windings Ns1, Ns2. In the illustrated embodiment, the rectifier 440 consists of two rectifying diodes Ds1, Ds2. Those skilled in the art should realize, however, that the use of any rectifier circuit is within the broad scope of the present invention. The power train 410 further includes an output filter circuit 450 that couples the rectifier 440 to the electrical load R. In this embodiment of the present invention, the output filter circuit 450 consists of a filter capacitor Cf. In general, however, any output filter circuit may be used. The power train 410 still further includes a snubber circuit 460.

The snubber circuit 460 includes an energy storage device, for instance, a snubber capacitor Ca. The snubber circuit 460 further includes a first snubber switch Qb that regulates a snubber capacitor voltage Vca across the snubber capacitor Ca. In the illustrated embodiment, the first snubber switch Qb is a metaloxide semiconductor field-effect transistor (MOSFET). Those skilled in the art should realize, however, that the use of any switching device is within the broad scope of the present invention. The snubber circuit 460 further includes a snubber inductor Ls, coupled to the first snubber switch Qb, that provides a discharge path for energy stored in the snubber capacitor Ca when the first snubber switch Qb is conducting. The snubber circuit 460 further includes a second snubber switch Ds that recovers energy stored in the snubber inductor Ls to the load R when the first snubber switch Qb is not conducting. In the illustrated embodiment, the second snubber switch Ds is a diode. In general, however, any switching device may be used. The snubber circuit 460 further includes an auxiliary switch Qa that regulates the snubber capacitor voltage Vca. In this embodiment of the present invention, the auxiliary switch Qa is a MOSFET. Those skilled in the art should realize, however, that any switching device may be used. The snubber circuit 460 still further includes an output inductor Lf, coupled to the auxiliary switch Qa, that provides a discharge path for energy stored in the snubber capacitor Ca when the auxiliary switch Qa is conducting.

Figure 5A:
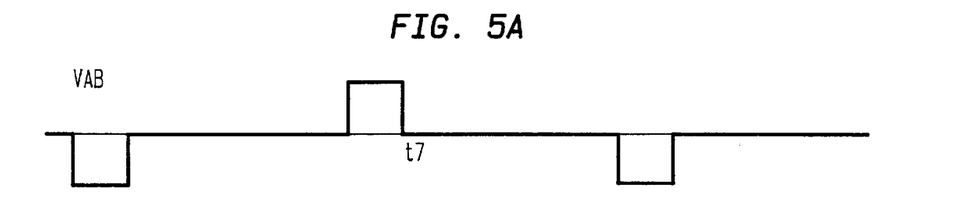
FIG. 5 illustrates voltage and current waveforms of selected operational characteristics of the power converter of FIG. 4 during a current limit mode of operation.
Figure 5B:
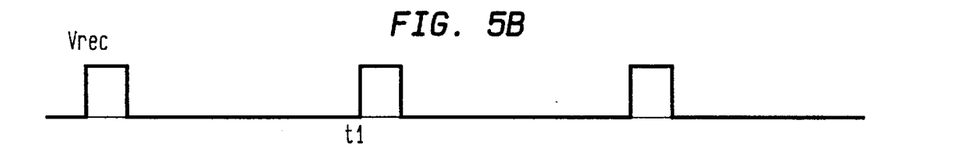
Figure 5C:
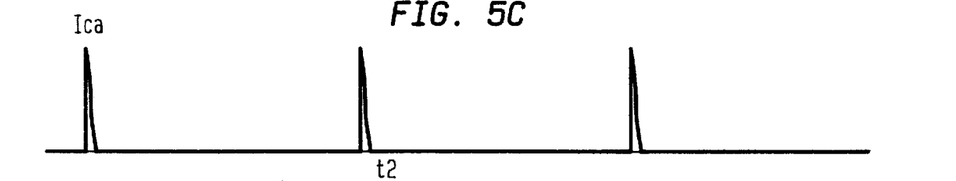
Figure 5D:
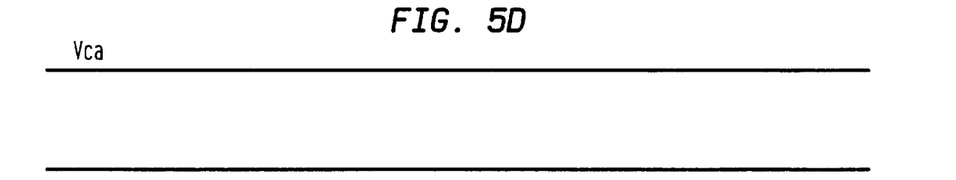
Figure 5E:
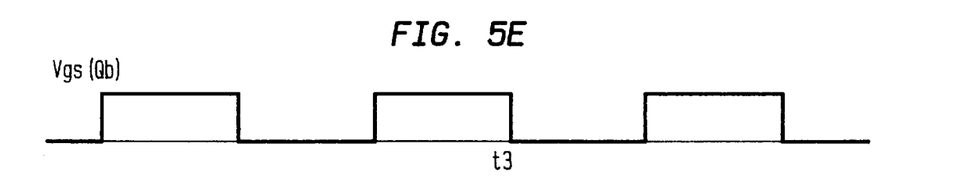

Turning now to FIGS. 5A through 5G, illustrated are voltage and current waveforms of selected operational characteristics of the power converter 400 of FIG. 4 during a current limit mode of operation. In particular, FIG. 5A represents a primary voltage VAB across the primary winding Np of the isolation transformer 420. FIG. 5B represents a rectifier voltage Vrec at an output of the rectifier 440. FIG. 5C represents a snubber capacitor current Ica through the snubber capacitor Ca. FIG. 5D represents the snubber capacitor voltage Vca across the snubber capacitor Ca. FIG. 5E represents a first snubber switch control voltage Vgs(Qb) applied to the first snubber switch by the control circuitry 490. FIG. 5F represents a first snubber switch current Ids(Qb) through the first snubber switch Qb. FIG. 5G represents a snubber inductor current I(Ls) through the snubber inductor Ls.

In the normal mode of operation, the snubber circuit 460 of FIG. 4 operates similarly to the snubber circuit 160 of FIG. 1. As previously mentioned, the snubber circuit 160 of FIG. 1 is ineffective in reducing the voltage stress in the current limit mode of operation where the duty cycle of the switching circuitry is shorter. For the purposes of the present invention, the current limit mode of operation generally includes a period when the switching circuitry 430 is restrained to a narrow duty cycle and the power converter 400 experiences heavy current draw.

With continuing reference to FIG. 4, the power converter 400 operates as follows in the current limit mode of operation. The switches Q1, Q2, Q3, Q4 are turned on in alternating pairs for a short time each cycle, impressing the input voltage Vi across the primary winding Np (see FIG. 5A). At a first time t1, the rectifier voltage Vrec goes high, and a snubber capacitor current Ica starts to flow into the snubber capacitor Ca through a body diode Dqa of the auxiliary switch Qa (see FIGS. 5B and 5C). The snubber capacitor current Ica decays, reaching zero at a second time t2. The control circuitry 490 senses the snubber capacitor voltage Vca and turns on the first snubber switch Qb instead of the auxiliary switch Qa if the snubber capacitor voltage Vca exceeds a predetermined value (see FIG. 5E). With the first snubber switch Qb on, the snubber capacitor Ca may discharge current to the output through the first snubber switch Qb and the snubber inductor Ls. The first snubber switch current Ids(Qb) and the snubber inductor current I(Ls) increases as the snubber capacitor Ca discharges (see FIGS. 5F and 5G). Later, at a third time t3, the first snubber switch Qb is turned off. The snubber inductor current I(Ls) decays to zero through the freewheeling second snubber switch Ds. The operation of the first and second snubber switches Qb, Ds, and the snubber inductor Ls substantially limits the snubber capacitor voltage Vca to a predetermined value. Thus, the voltage stress across the rectifying diodes Ds1, Ds2 does not exceed a specified level. The snubber circuit 460 of the present invention, therefore, reduces the voltage stress across the rectifier during the normal and current limit modes of operation thereby minimizing losses associated with the rectifier.

Those skilled in the art should understand that the previously described embodiment of the snubber circuit 460 (and converter topology employed therewith) is submitted for illustrative purposes only, and other embodiments capable of reducing the voltage stress associated with the rectifier of a converter employing switching circuitry and an inductive element are well within the broad scope of the present invention. For a better understanding of power electronics, power converter topologies, such as the FPP converter, and snubber circuits see Principles of Power Electronics, by J. Kassakian, M. Schlecht, Addison-Wesley Publishing Company (1991) and Design Considerations for High-Power Full-Bridge Zero-Voltage-Switched PWM Converter, by A. Sabate, V. Vlatkovic, R. B. Ridley, F. C. Lee and B. H. Cho, IEEE Applied Power Electronics Conference, pages 275–284 (1990). The aforementioned references are herein incorporated by reference.

Although the present invention has been described in detail, those skilled in the art should understand that they can make various changes, substitutions and alterations herein without departing from the spirit and scope of the invention in its broadest form.

What is claimed is:

1. For use in a power converter having a rectifier coupled to an output thereof, a snubber circuit including an energy storage device coupled to said rectifier that moderates a voltage across said rectifier, said snubber circuit comprising:
    a first switch that regulates a voltage across said energy storage device;
    an inductor, coupled to said first switch, that provides a discharge path for energy stored in said energy storage device when said first switch is conducting; and
    a second switch that recovers energy stored in said inductor to said output when said first switch is not conducting, said snubber circuit thereby reducing a voltage stress across said rectifier during a current limit mode of operation.

2. The snubber circuit as recited in claim 1 further comprising:
    an auxiliary switch that regulates a voltage across said energy storage device; and
    an output inductor, coupled to said auxiliary switch, that provides a discharge path for energy stored in said energy storage device when said auxiliary switch is conducting, said snubber circuit thereby reducing a voltage stress across said rectifier during a normal mode of operation.

3. The snubber circuit as recited in claim 1 wherein said first switch is a metal-oxide semiconductor field-effect transistor (MOSFET).

4. The snubber circuit as recited in claim 1 wherein said second switch is a diode.

5. The snubber circuit as recited in claim 1 wherein said energy storage device is a capacitor.

6. The snubber circuit as recited in claim 1 wherein said rectifier comprises a plurality of rectifying diodes.

7. The snubber circuit as recited in claim 1 wherein said power converter comprises a transformer having a secondary winding, said snubber circuit coupled to said rectifier and said secondary winding.

8. For use in a power converter having a rectifier coupled to an output thereof, a method of moderating a voltage across said rectifier having an energy storage device coupled thereto, comprising the steps of:
    regulating a voltage across said energy storage device with a first switch;
    providing a discharge path through an inductor, coupled to said first switch, for energy stored in said energy storage device when said first switch is conducting; and
    recovering energy stored in said inductor to said output with a second switch when said first switch is not conducting, said snubber circuit thereby reducing a voltage stress across said rectifier during a current limit mode of operation.

9. The method as recited in claim 8 further comprising the steps of:
    regulating a voltage across said energy storage device with an auxiliary switch; and
    providing a discharge path through an output inductor, coupled to said auxiliary switch, for energy stored in said energy storage device when said auxiliary switch is conducting, said snubber circuit thereby reducing a voltage stress across said rectifier during a normal mode of operation.

10. The method as recited in claim 8 wherein said first switch is a metal-oxide semiconductor field-effect transistor (MOSFET).

11. The method as recited in claim 8 wherein said second switch is a diode.

12. The method as recited in claim 8 wherein said energy storage device is a capacitor.

13. The method as recited in claim 8 wherein said rectifier comprises a plurality of rectifying diodes.

14. The method as recited in claim 8 wherein said power converter comprises a transformer having a secondary winding, said snubber circuit coupled to said rectifier and said secondary winding.

15. A power converter, comprising:
    a power train having an input couplable to a source of electrical power and a DC output couplable to an electrical load, said power train including:
        an isolation transformer having a primary winding and a secondary winding, switching circuitry coupled to said primary winding, a rectifier, coupled to said secondary winding, having a plurality of rectifying diodes, and a snubber circuit having an energy storage device coupled to said rectifier that moderates a voltage across said rectifier, comprising:
- a first switch that regulates a voltage across said energy storage device;
- an inductor, coupled to said first switch, that provides a discharge path for energy stored in said energy storage device when said first switch is conducting, and
- a second switch that recovers energy stored in said inductor to said load when said first switch is not conducting, said snubber circuit thereby reducing a voltage stress across said rectifier during a current limit mode of operation; and control circuitry for applying control signals to said power train.

16. The power converter as recited in claim 15 further comprising:
- an auxiliary switch that regulates a voltage across said energy storage device; and
- an output inductor, coupled to said auxiliary switch, that provides a discharge path for energy stored in said energy storage device when said auxiliary switch is conducting, said snubber circuit thereby reducing a voltage stress across said rectifier during a normal mode of operation.

17. The power converter as recited in claim 15 further comprising an output filter circuit.

18. The power converter as recited in claim 15 wherein said first switch is a metal-oxide semiconductor field-effect transistor (MOSFET).

19. The power converter as recited in claim 15 wherein said second switch is a diode.

20. The power converter as recited in claim 15 wherein said energy storage device is a capacitor.

* * * * *